(12) United States Patent
Chen et al.

(10) Patent No.: US 7,291,225 B2
(45) Date of Patent: Nov. 6, 2007

(54) HEAT SHIELD AND CRYSTAL GROWTH EQUIPMENT

(75) Inventors: Jyh-Chen Chen, Taoyuan (TW); Bing-Jung Chen, Taoyuan (TW); Gwo-Jiun Sheu, Taoyuan (TW); Farn-Shiun Hwu, Taoyuan (TW)

(73) Assignee: National Central University, Taoyuan (TW)

( * ) Notice: Subject to any disclaimer, the term of this patent is extended or adjusted under 35 U.S.C. 154(b) by 52 days.

(21) Appl. No.: 11/163,855

(22) Filed: Nov. 1, 2005

(65) Prior Publication Data

US 2006/0090695 A1    May 4, 2006

(30) Foreign Application Priority Data

Nov. 4, 2004    (TW)    ............................... 93133599 A

(51) Int. Cl.
*C30B 35/00*    (2006.01)
(52) U.S. Cl. .................. 117/217; 117/218; 117/219; 117/222
(58) Field of Classification Search ............. 117/217, 117/218, 219, 222
See application file for complete search history.

(56) References Cited

U.S. PATENT DOCUMENTS

| 5,476,065 | A | | 12/1995 | Ikezawa et al. ............. 117/217 |
| 5,951,753 | A | | 9/1999 | Dornberger et al. ........... 117/3 |
| 5,997,635 | A | * | 12/1999 | Kubota et al. ................ 117/14 |
| 6,569,237 | B2 | | 5/2003 | Tanaka et al. ............... 117/19 |
| 6,676,753 | B2 | | 1/2004 | Park .......................... 117/217 |

* cited by examiner

*Primary Examiner*—Felisa Hiteshew
(74) *Attorney, Agent, or Firm*—Jianq Chyun IP Office

(57) ABSTRACT

A heat shield and a crystal growth equipment are provided, in which the length-adjustable and hybrid-angle heat shield is provided for the crystal growth equipments. The heat shield is adapted for not only guiding the inert gas flow but also speeding up the flow rate of the gas and the cooling rate of the crystal so as to raise the axial temperature gradient at the solid-molten interface, the growth rate of the crystal and the productivity. The heat shield further can also reduce the possibility of microdefect nucleation to improve the quality of crystal at the same time. In addition, the length of heat shield can be adjusted according to the distance between the heat shield and the semiconductor material melt in different crucibles in case that the crucibles are made by different factories. This can reduce the cost of the heat shield manufacturing.

19 Claims, 5 Drawing Sheets

HEAT SHIELD AND CRYSTAL GROWTH EQUIPMENT

CROSS-REFERENCE TO RELATED APPLICATION

This application claims the priority benefit of Taiwan application serial no. 93133599, filed on Nov. 4, 2004. All disclosure of the Taiwan application is incorporated herein by reference.

BACKGROUND OF THE INVENTION

1. Field of the Invention

The present invention relates to a crystal growth equipment and a heat shield using in a silicon wafer process, and more particularly, to a crystal growth equipment using a Czochralski method and a length-adjustable and hybrid-angle heat shield.

2. Description of the Prior Art

The semiconductor develops from the 6-inch wafer, 8-inch wafer to the current 12-inch wafer. As the caliber of the wafer becomes larger, the crystal growth equipment and its technique should be upgraded continually.

In a wafer process, bulk single crystal silicon is the foundation of the silicon wafer, and the method of manufacturing the bulk single crystal silicon may be classified as the Czochralski method and the Floating Zone method, wherein, the Czochralski crystal growth equipment to extract the silicon single crystal is the most commonly used method nowadays.

FIG. 1 shows a sectional view of a Czochralski crystal growth equipment using a conventional heat shield. Referring to FIG. 1, a crucible 110 is disposed in a (Czochralski) puller 100, the crucible 110 is filled with semiconductor material melt 112, for example silicon melt, and a heater 102 is placed outside the crucible 110 to heat up the semiconductor material melt 112. A seed 116 is placed on the surface of the semiconductor material melt 112 in the puller 100. Pull up the seed 116, and the semiconductor material melt 112 attached to the seed 116 will be solidified into a single crystal 114. Otherwise, a support 104 is disposed outside the heater 102 in the puller 100, so that when a heat shield 118 is placed in the crucible 110, its cantilever 130 can be placed on the support 104 horizontally and its total weight be supported by the support 104.

The process of manufacturing the above-mentioned single crystal 114 is performed as follows: first put the semiconductor material into the crucible 110; melt the semiconductor material into the semiconductor material melt 112 at high temperature; then rotate the crucible 110 and contact the seed 116 with the semiconductor material melt 112; and then rotate the seed 116 in an opposite direction to that of the crucible 110 and pull it up slowly, and thereby the pulled-up part is solidified into the single crystal 114. When pulling up the seed 116 and the solidified single crystal 114, the heat shield 118 having an appropriate length to design a flow rate is provided to isolate the heat provided by the heater 102, at the same time the inert gas 140 above is fed into the puller 100 through a pumping unit (not shown) and flows into the space between the heat shield 118 and the single crystal 114 along the path. Therein, as the flow pitch is narrowed when the inert gas 140 passes through the bottom edge of the heat shield 118, the flow rate of the inert gas 140 is speeded up, and the oxide, for example the silicon oxide, resulted from the reaction on the semiconductor material melt 112 surface is taken away quickly from the silicon melt 112 surface. As the flow rate of inert gas 140 is very quick, the resulted oxide can be prevented from being melted back to the silicon melt 112 to produce a secondary pollution.

However, in the design of the path on which the inert gas 140 flows, if using the conventional heat shield 118 with a signal angle θ (i.e., the angle between the vertical wall 132 and the extension element part 136), a relatively large amount of argon gas is demanded to effectively cool the single crystal 114, and therefore the consumption of argon gas is rather great and the cost is high. Previously, efforts were made to aid the crystal growth by perforating the heat shield or changing the shape of the heat shield, but the process was too complicated; in addition, as the geometric shape of the furnace bodies are different by different factories, the installation position of the heat shield is influenced, so that a crucible can only be configured with heat shields with the same length, which burdens the cost indirectly.

SUMMARY OF THE INVENTION

An objective of the present invention is to provide a heat shield, to raise the quality of the silicon single crystal growth, raise the growth rate of the silicon single crystal and reduce the argon gas consumption, thereby reducing the crystal growth cost.

Another objective of the present invention is to provide a crystal growth equipment, to raise the quality of the silicon single crystal growth, raise the growth rate of the silicon single crystal and reduce the argon gas consumption.

To achieve the above objectives, the present invention provides a cylinder heat shield with different section diameters. The heat shield mainly comprises a cantilever, a vertical wall and an extension element, wherein the cantilever has a horizontal surface, and the vertical wall is connected beneath the horizontal surface of the cantilever and has a cylinder shape with a first length. In addition, the extension element has a cylinder shape with a second length, and is adjustably disposed beneath the vertical wall. The extension element has a first chamfer and a second chamfer sequentially at the bottom edge, with the first chamfer and the vertical wall forming a first obtuse angle, and the second chamfer and the vertical wall forming a second obtuse angle, wherein the first obtuse angle is smaller than the second obtuse angle.

According to a preferred embodiment of the present invention, the cantilever and the vertical wall are for example formed integrally, and their material is for example quartz or aluminium oxide.

According to a preferred embodiment of the present invention, the material of the extension element is for example quartz or aluminium oxide.

According to a preferred embodiment of the present invention, the extension element has a first and a second chamfer with different angles. The first obtuse angle of the extension element is for example between 100-130 degrees, and most preferably for example 120 degrees. The second obtuse angle of the extension element is between 130-160 degrees, and most preferably for example 140 degrees.

According to a preferred embodiment of the present invention, the extension element further has an adjuster, such as a screw, by which the vertical wall and the extension element are fixed detachably.

To achieve the above objects, the present invention provides a crystal growth equipment, which comprises a puller, a crucible, a heater, a heat shield and a pumping unit. The puller is used to pull up the seed. The crucible is disposed in the puller, and the semiconductor material melt is placed in the crucible for use. The heater is disposed outside the crucible for heating the semiconductor material into melt, and then a single crystal is formed on the seed by withdrawing. The heat shield is supported by a support after being placed in the crucible. The heat shield mainly comprises a cantilever, a vertical wall and an extension element, wherein the cantilever of the heat shield has a horizontal surface, and the vertical wall is connected beneath the horizontal surface of the cantilever and has a cylinder shape with a first length. In addition, the extension element has a cylinder shape with a second length, and is disposed adjustably beneath the vertical wall. The bottom edge of the extension element has a first and a second chamfer sequentially, with the first chamfer and the vertical wall forming a first obtuse angle, and the second chamfer and the vertical wall forming a second obtuse angle, wherein the first obtuse angle is smaller than the second obtuse angle. In addition, an inert gas flows into the space between the heat shield and the seed through the pumping unit, and the flow rate of the inert gas passing the first chamfer is smaller than that passing the second chamfer.

According to a preferred embodiment of the present invention, the material of the crucible is for example quartz.

According to a preferred embodiment of the present invention, the semiconductor material melt is for example silicon.

According to a preferred embodiment of the present invention, the material of the heater is for example graphite.

According to a preferred embodiment of the present invention, the cantilever and the vertical wall of the heat shield is for example formed integrally and their material is for example quartz or aluminium oxide.

According to a preferred embodiment of the present invention, the material of the extension element of the heat shield is for example quartz or aluminium oxide.

According to a preferred embodiment of the present invention, the extension element further comprises an adjuster, such as a screw, by which the vertical wall and the extension element are fixed detachably.

According to a preferred embodiment of the present invention, the extension element has a first and a second chamfer with different angles, wherein the first obtuse angle is for example between 100-130 degrees, and most preferably for example 120 degrees, and the second obtuse angle is for example between 130-160 degrees, and most preferably for example 140 degrees.

According to a preferred embodiment of the present invention, the inert gas is for example argon gas.

The above and other features of the present invention will be better understood from the following detailed description of the preferred embodiments of the invention which is provided in communication with the accompanying drawings.

DESCRIPTION OF THE EMBODIMENTS

DETAILED DESCRIPTION

Figure 1:
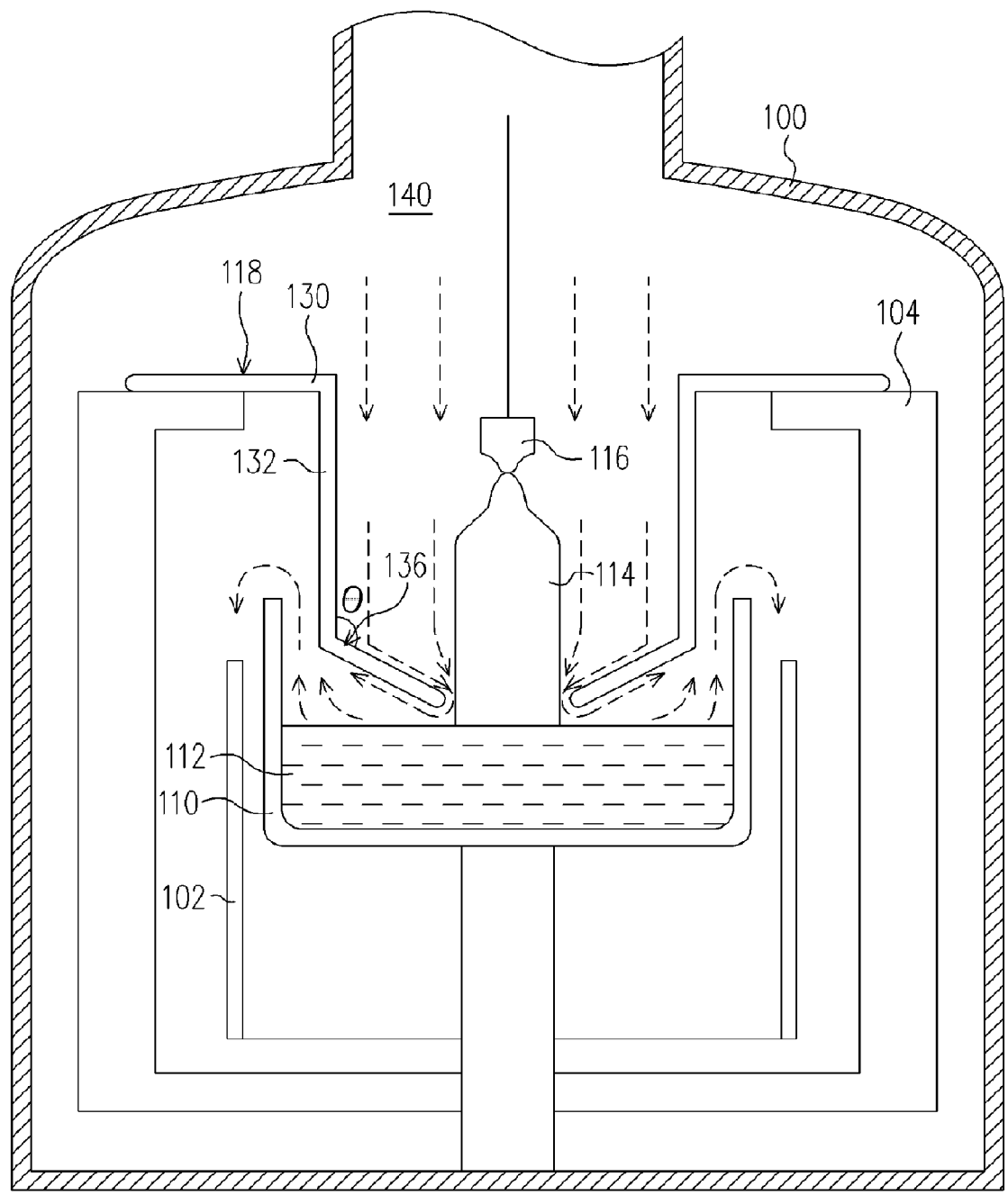
FIG. 1 is a schematic sectional view of a Czochralski crystal growth equipment using a conventional heat shield.
Figure 2A:
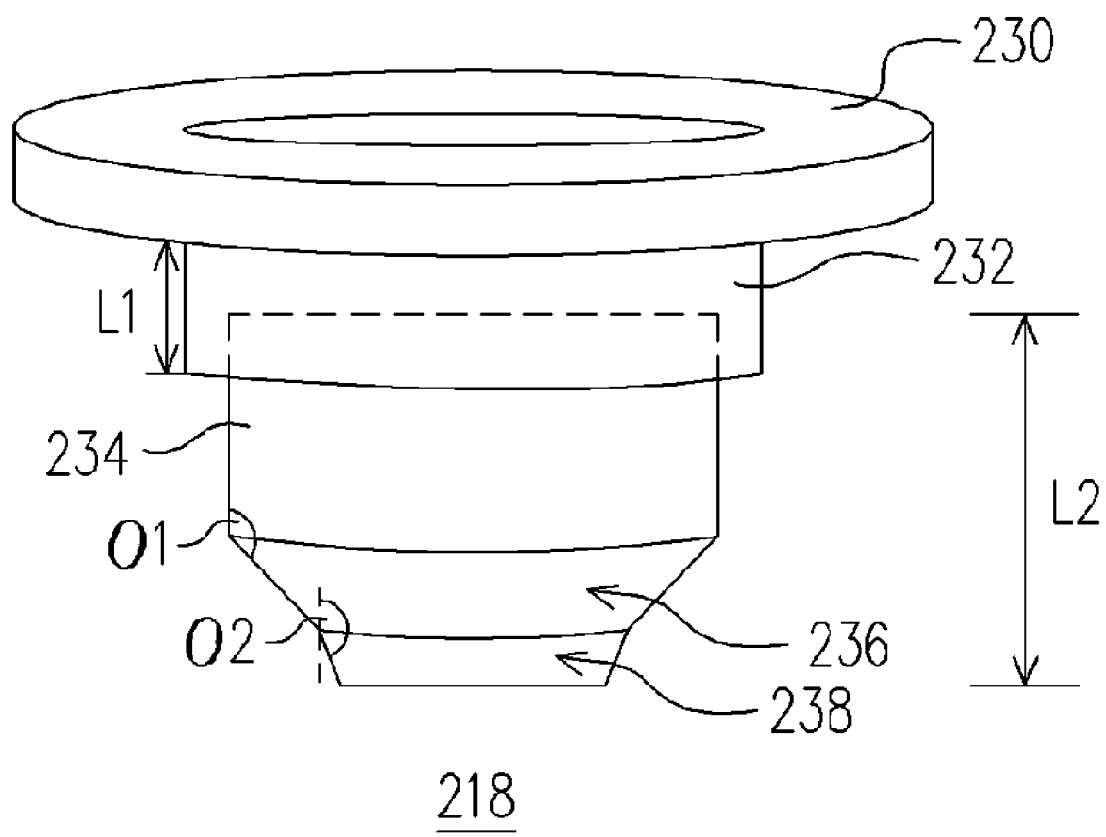
FIG. 2A is a schematic stereogram of a heat shield according to the present invention.

Referring to FIG. 2A, it is a schematic stereogram of a heat shield according to the present invention.

The heat shield 218 is mainly consisted of a cantilever 230, a vertical wall 232 and an extension element 234, wherein the material of the heat shield 218 is for example quartz or aluminium oxide. The vertical wall 232 has a cylinder shape with a first length L1. And the extension element 234 may be disposed beneath the vertical wall 232 by an adjuster (not shown), and has a second length L2, so that the total length of the heat shield 218 may be optionally adjusted, and the second length L2<the total length of the heat shield<the first length L1+the second length L2. In addition, the extension element 234 has a first chamfer 236 and a second chamfer 238 sequentially at the bottom edge, which form a first obtuse angle $\Theta 1$ and a second obtuse angle $\Theta 2$ with the vertical wall 232 respectively, wherein the first obtuse angle $\Theta 1$ is smaller than the second obtuse angle $\Theta 2$. In the present embodiment, with the property of detachable adjustment of the extension element, the relative distance between the second chamfer 238 and the surface of the semiconductor material melt 212 in the heat shield 218 may be adjusted according to the crucibles made by different factories, and therefore the cost of repeatedly designing and manufacturing the heat shield can be saved.

Figure 2B:
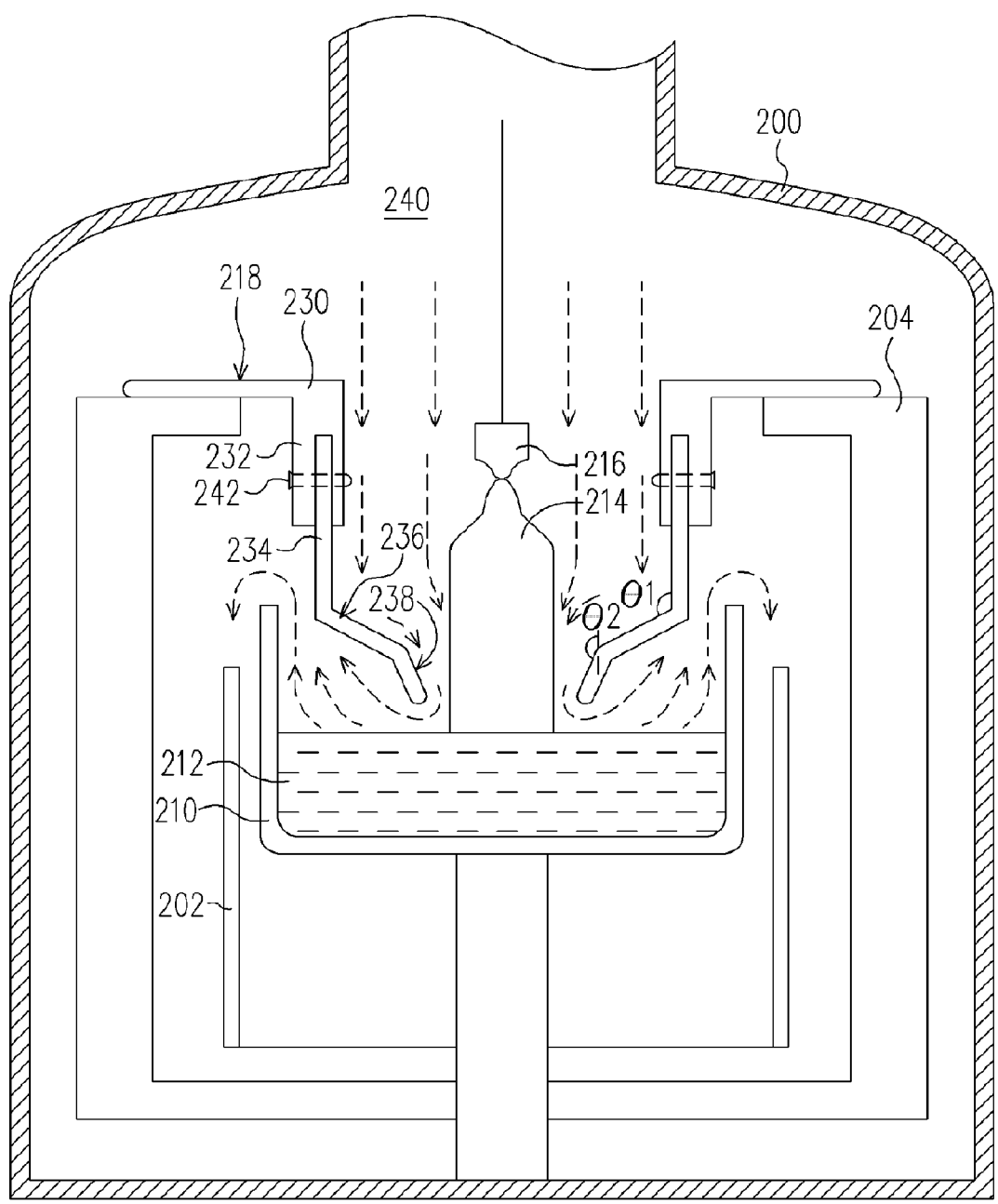
FIG. 2B is a schematic sectional view of a Czochralski crystal growth equipment using the heat shield according to the present invention.

Referring to FIG. 2B, it is a schematic sectional view of a Czochralski crystal growth equipment using the heat shield of the present invention.

The crystal growth equipment mainly comprises a puller 200, a crucible 210, a heater 202, a heat shield 218 and a pumping unit (not shown), wherein the crucible 210 is disposed in the puller 200, and the semiconductor material melt 212, for example silicon melt, is placed in the crucible 210 for the crystal growth. In addition, the heater 202 is disposed outside the crucible 210 for heating the semiconductor material melt 212 to form a single crystal 214 on the seed 216. Furthermore, a support 204 is disposed outside the heater 202 in the puller 200. Besides, the heat shield 218 is disposed above the crucible 210, with its cantilever 230 horizontally disposed on the support 204 to support total weight of the heat shield 218 by the support 204. The pumping unit is disposed for transporting the inert gas 240, such as argon gas.

The method of manufacturing the single crystal 214 is generally described as follows: first dispose the crucible 210 for placing the semiconductor material melt 212 in the puller 200, wherein the material of the semiconductor material melt 212 is for example silicon, and the material of the crucible 210 is for example quartz; rotate the crucible 210 slowly; then contact the seed 216 with the semiconductor material melt 212, and then rotate the seed 216 in an opposite direction relative to the crucible 210 and pulling it up slowly, and at that time the pulled-up part is solidified into the single crystal 214. When pulling up the single crystal 214, the heat shield 218 of the present invention is used to isolate the heat provided by the heater 202, and also the inert gas 240 above is fed into the puller 200 through the pumping unit and flows into the space between the heat shield 218 and the seed 216.

It should be noted that, the extension element 234 of the heat shield 218 has a first chamfer 236 and a second chamfer 238 sequentially at the bottom edge, which form a first obtuse angle $\Theta 1$ and a second obtuse angle $\Theta 2$ with the vertical wall 232 respectively, wherein the first obtuse angle $\Theta 1$ is smaller than the second obtuse angle $\Theta 2$. The first obtuse angle $\Theta 1$ in the above design of two angles has an effect of air conduction, and can guide the inert gas 240 gathered around the single crystal 214 to aid the cooling of the single crystal 214 effectively, so as to reduce the possibility of microdefect nucleation. In addition, the second obtuse angle $\Theta 2$ in the above design of two angles can speed up the flow rate of the inert gas 240, and rapidly take the oxide resulted from the reaction away from the crucible 210, and raise the temperature gradient at the interface between the single crystal 214 and the semiconductor material melt 212, to speed up the growth rate of the single crystal 214.

Figure 3:
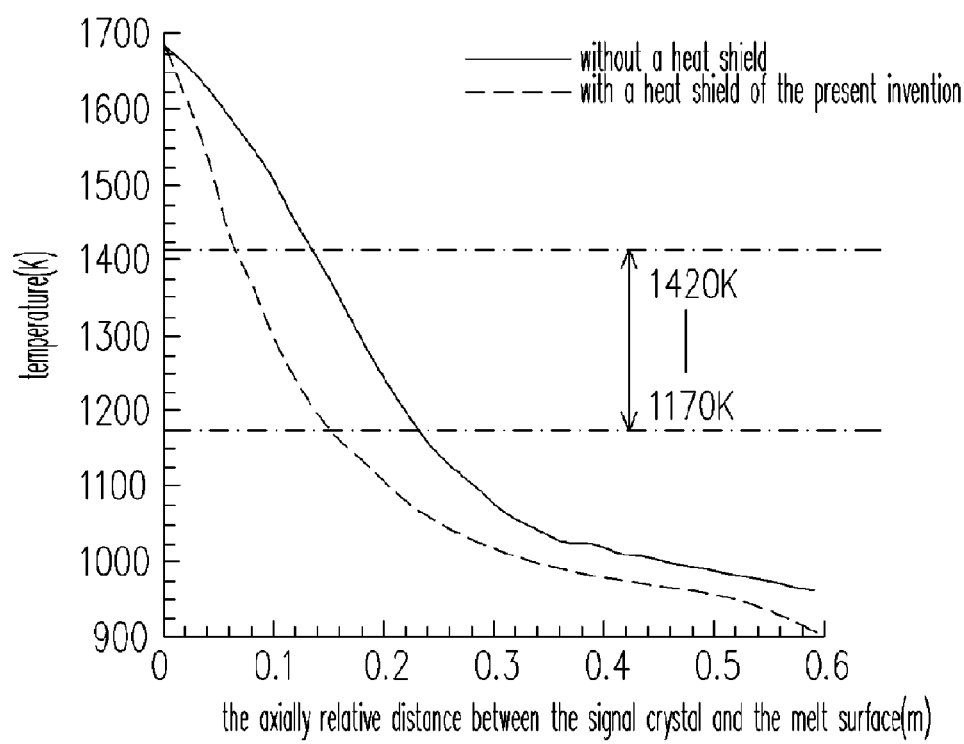
FIG. 3 is a temperature field distribution diagram of a single crystal, furnished with a heat shield of the present invention and without a heat shield.

FIG. 3 is a temperature field distribution diagram of a single crystal, furnished with a heat shield of the present invention and without a heat shield. Referring to FIGS. 2B and 3 at the same time, the first obtuse angle $\theta 1$ of the heat shield 218 in the present invention is for example between 100~130 degrees, and most preferably 120 degrees with a most preferable effect of air conduction. The first obtuse angle $\theta 1$ mainly guides argon gas to take away the heat on the single crystal 214 when flowing past the single crystal 214, so as to aid the cooling of the single crystal 214. Referring to FIG. 3, the comparison of the single crystals 214 with/without a heat shield shows that their history heat difference within the microdefect nucleation temperature range (1170K~1420K) may reach 120-180 k. And therefore, with the heat shield 218 furnished, the temperature bandwidth (1170K-1420K) of the single crystal 214 which is in the microdefect nucleation can be shortened during the manufacture, reducing the possibility of microdefect nucleation.

Figure 4:
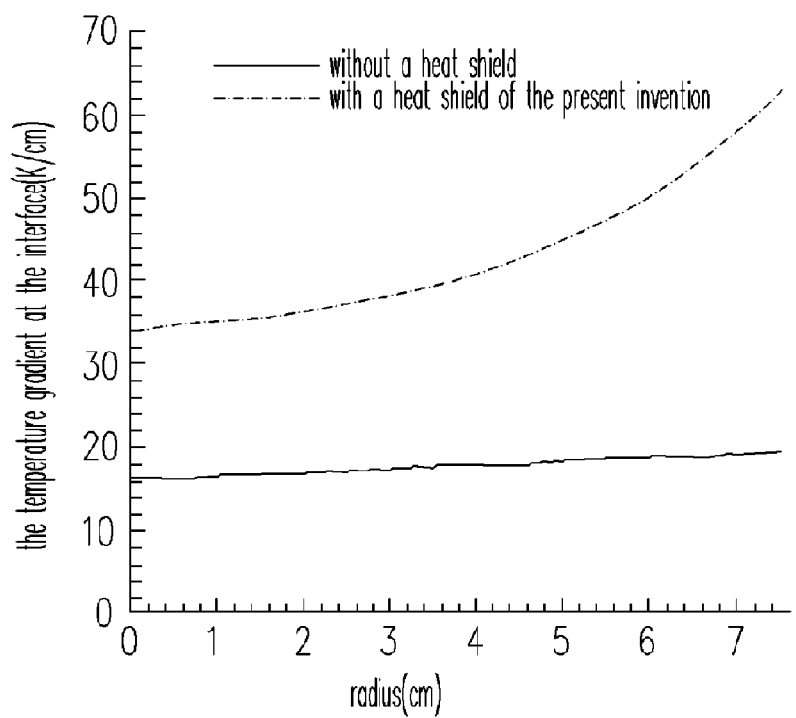
FIG. 4 is a comparison diagram of temperature gradients at the axial solid-molten interfaces, furnished with the heat shield of the present invention and without a heat shield.

FIG. 4 is a comparison diagram of temperature gradients at the axial solid-molten interfaces, furnished with the heat shield of the present invention and without a heat shield. Referring to FIGS. 2B and 4, the second obtuse angle $\Theta 2$ of the heat shield 218 in the present embodiment is for example between 120~160 degrees, and most preferably 140 degrees, so as to raise the axial solid-molten interface to a most preferable temperature gradient variation, thereby raising the growth rate of the single crystal 214. As can be seen from FIG. 4, the temperature gradient of the solid-molten interface changes more greatly with the furnished heat shield 218, which may speed up the crystal growth rate at the interface.

While designing the flow path of the argon gas, due to the design of a hybrid-angle, the distance between the single crystal 214 and the heat shield 218 is narrowed, which speeds up the argon gas in two stages and takes away the heat on the single crystal 214 quickly to cool the single crystal 214. As known from that, the hybrid angles $\Theta 1$, $\Theta 2$ speed up the flow rate, and are able to raise the axial temperature gradient at the solid-molten interface by using the argon gas effectively, whereby adjusting the growth rate of the single crystal 214 to reduce the possibility of the microdefect nucleation, and raising the growth quality of the single crystal 214.

Figure 5:
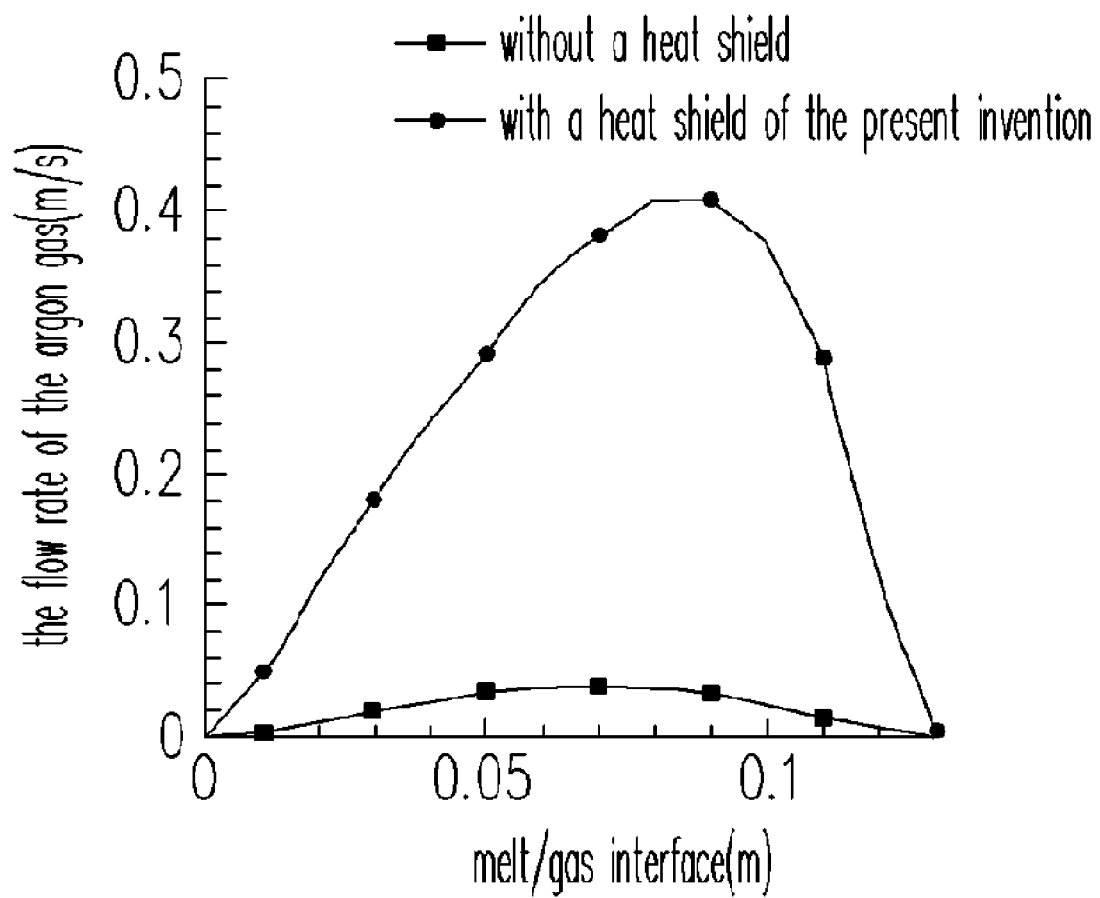
FIG. 5 is a vector diagram of the gas flow rate at the melt surfaces, furnished with a heat shield of the present invention and without a heat shield.

FIG. 5 is a vector diagram of the gas flow rate on the melt surfaces, furnished with a heat shield of the present invention and without a heat shield. Referring to FIG. 5, with the heat shield 218 furnished, the oxide resulted from the reaction may be taken away quickly from the crucible 210 by the argon gas, and thereby preventing the oxide from being melted back into the semiconductor material melt 212 to cause a secondary pollution.

Furthermore, the heat shield 218 adjusts the distance between the bottom edge of the extension element 234 and the semiconductor material melt 212 by using the length-adjustable extension element 234, so that the heat shield 218 may be applied to the crucibles 210 designed by different factories, thus saving the manufacturing cost.

To sum up, the structure of the present invention has at least the following advantages.

1. For the design of the angle of the heat shield, the design of two angles has many advantages: for example, guiding the gas flow, speeding up the flow rate of the argon gas, cooling the single crystal effectively by argon gas, raising the axial temperature gradient at the solid-molten interface, raising the crystal growth rate, reducing the possibility of the microdefect nucleation of the single crystal, raising the growth quality of the single crystal, reducing the consumption of the argon gas. In addition, it may also improve the flow field in the furnace body, and prevent the oxide resulted from the reaction from being melted back into the semiconductor material melt, thereby to alleviate the secondary pollution.

2. For the length-adjustable design of the heat shield, the extension element can be applied to the crucibles with different geometric shapes made by different factories, and the manufacturing of heat shields with the same length adapted for an individual crucible can be avoided, so that the manufacturing cost is reduced.

Although the present invention has been disclosed according to the preferred embodiments, they are not intended to limit the present invention. Those skilled in the art can make many variations and modifications without departing from the spirit and scope of the present invention, and the scope of the present invention shall be defined by the appended claims.

What is claimed is:

1. A heat shield adapted for a Czochralski crystal growth equipment, the heat shield comprising:
   a cantilever having a horizontal surface;
   a vertical wall connected beneath the horizontal surface of the cantilever and has a cylinder shape with a first length; and
   an extension element, adjustably disposed beneath the vertical wall and having a cylinder shape with a second length, wherein the extension element has a first chamfer and a second chamfer sequentially at the bottom edge, with the first chamfer and the vertical wall forming a first obtuse angle, and the second chamfer and the vertical wall forming a second obtuse angle, wherein the first obtuse angle is smaller than the second obtuse angle.

2. The heat shield of claim 1, wherein the cantilever and the vertical wall are formed integrally.

3. The heat shield of claim 1, wherein the material of the cantilever and the vertical wall is quartz or aluminium oxide.

4. The heat shield of claim 1, wherein the material of the extension element is quartz or aluminium oxide.

5. The heat shield of claim 1, further comprising an adjuster detachably connected between the vertical wall and the extension element.

6. The heat shield of claim 5, wherein the adjuster includes screws.

7. The heat shield of claim 1, wherein the first obtuse angle is between 100~130 degrees.

8. The heat shield of claim 1, wherein the second obtuse angle is between 130~160 degrees.

9. A crystal growth equipment, comprising:
a puller for pulling up a seed;
a crucible disposed in the puller for placing a semiconductor material melt;
a heater disposed at the periphery of the crucible for heating the semiconductor material melt, to form a single crystal on the seed;
a heat shield disposed on the crucible, the heat shield comprising:
a cantilever having a horizontal surface fixed in the puller;
a vertical wall connected beneath the horizontal surface of the cantilever, the vertical wall having a cylinder shape with a first length; and
an extension element adjustably disposed under the vertical wall, wherein the extension element has a cylinder shape with a second length, and has a first and a second chamfer sequentially at the bottom edge, with the first chamfer and the vertical wall forming a first obtuse angle, and the second chamfer and the vertical wall forming a second obtuse angle, wherein the first obtuse angle is smaller than the second obtuse angle; and
a pumping unit for passing the inert gas between the heat shield and the crystalline, and the flow rate of the inert gas passing the first chamfer is smaller than that passing the second chamfer.

10. The crystal growth equipment of claim 9, wherein the cantilever and the vertical wall are formed integrally.

11. The crystal growth equipment of claim 9, wherein the material of the cantilever and the vertical wall is quartz or aluminium oxide.

12. The crystal growth equipment of claim 9, wherein the material of the extension element is quartz or aluminium oxide.

13. The crystal growth equipment of claim 9, further comprising an adjuster, detachably connected between the vertical wall and the extension element.

14. The crystal growth equipment of claim 13, wherein the adjuster includes screws.

15. The crystal growth equipment of claim 9, wherein the first obtuse angle is between 100~130 degrees.

16. The crystal growth equipment of claim 9, wherein the second obtuse angle is between 130~160 degrees.

17. The crystal growth equipment of claim 9, wherein the material of the crucible is quartz.

18. The crystal growth equipment of claim 9, wherein the semiconductor material melt is silicon.

19. The crystal growth equipment of claim 9, wherein the inert gas is argon gas.

* * * * *